United States Patent [19]
Hebbeker et al.

[11] Patent Number: 5,661,331
[45] Date of Patent: Aug. 26, 1997

[54] FUSE BANK

[75] Inventors: Heinz Hebbeker, Bayersoien; Werner Reczek, Ottobrunn; Dominique Savignac, Ismaning; Hartmud Terletzki, München, all of Germany

[73] Assignee: Siemens Aktiengesellschaft, Munich, Germany

[21] Appl. No.: 671,796

[22] Filed: Jun. 24, 1996

[30] Foreign Application Priority Data

Jun. 23, 1995 [DE] Germany ............... 95 109853 U

[51] Int. Cl.$^6$ .............................................. H01L 29/00
[52] U.S. Cl. ........................................... 257/529; 257/379
[58] Field of Search ................................ 257/529, 379, 257/408, 547, 913

[56] References Cited

U.S. PATENT DOCUMENTS 4,723,155  2/1988  Uchida .................................. 257/379

FOREIGN PATENT DOCUMENTS 0076967  4/1983  European Pat. Off. .

OTHER PUBLICATIONS

Patent Abstracts of Japan, vol. 9, No. 248 (E-347), Oct. 4, 1985: and JP-A-60-098664 (Mitsubishi) Jun. 1, 1985.

Patent Abstracts of Japan, vol. 14, No. 55 (E-882), Jan. 31, 1990; and JP-A-12-78745 (Matsushita) Nov. 9, 1989.

Patent Abstracts of Japan, vol. 18, No. 359 (E-1574) Jul. 6, 1994; and JP-A-60-97379 (Yamaha) Apr. 8, 1994.

*Primary Examiner*—Mark V. Prenty
*Attorney, Agent, or Firm*—Herbert L. Lerner; Laurence A. Greenberg

[57] ABSTRACT

A fuse bank includes a fuse link being disposed above and insulated from a substrate. A first doped region in the substrate is a guard ring surrounding the fuse link. A second doped region has the same conduction type as the first doped region and is adjacent the first doped region. An insulation separates the second doped region from the first doped region. A high-impedance semiconductor component connects the first doped region to a first supply potential. The second doped region is connected to a second supply potential.

2 Claims, 1 Drawing Sheet

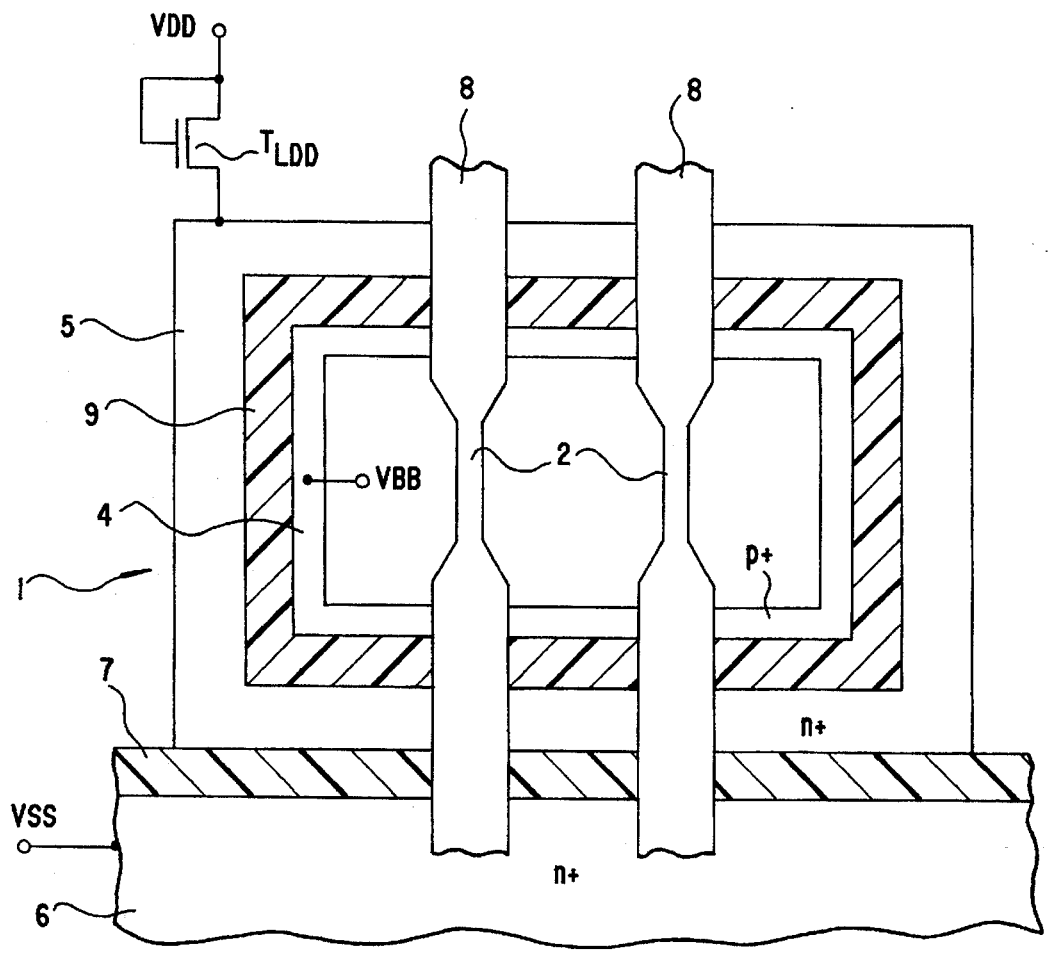

FUSE BANK

BACKGROUND OF THE INVENTION

FIELD OF THE INVENTION

The invention relates to a fuse bank.

Fuse banks are parts of integrated circuits. A fuse bank disposed above a substrate of an integrated circuit has a fuse link that is isolated from the integrated circuit. Fuse links (also known as "fuses" for short) are parts of electrically conductive regions that can be severed or destroyed mechanically or thermally, for instance. As is well known, by selectively severing the fuse links of an integrated circuit toward the end of their production process, a configuration of the integrated circuit can be accomplished. Severing or breaking the fuse links, which is typically carried out through the use of a laser, destroys a protective layer above the integrated circuit in the region of the fuse links, and it is possible for charged particles (ions) to penetrate the substrate located beneath the fuse links. In order to prevent the ions from migrating through the substrate, so-called "guard rings", which enclose a region around the fuse link, are often provided. The guard rings around the fuse links are disposed under the fuse links in the substrate and by way of example can be provided in the form of diffusions.

Such guard rings perform a so-called "getter function", that is they catch ions. To that end, they are each connected to one supply potential of the integrated circuit.

If a guard ring, which of course represents a first doped region, is adjacent a second doped region of the same conduction type, and if that second doped region is connected to a different supply potential from that of the first doped region, then a breakdown of a parasitic field effect transistor formed by the two doped regions and an intervening insulation can occur in the event of ESD (electrostatic discharge). In order to prevent a destructive breakdown of the parasitic transistor, the spacing between the two doped regions can be increased, so that the breakdown voltage increases as well. However, that requires additional layout area.

SUMMARY OF THE INVENTION

It is accordingly an object of the invention to provide a fuse bank, which overcomes the hereinafore-mentioned disadvantages of the heretofore-known devices of this general type and which provides another way to avoid ESD damage to a parasitic transistor formed by two doped regions.

With the foregoing and other objects in view there is provided, in accordance with the invention, a fuse bank, comprising a substrate; a fuse link being disposed above and insulated from the substrate; a first doped region in the substrate being a guard ring surrounding the fuse link; a second doped region having the same conduction type as the first doped region and being adjacent the first doped region; an insulation separating the second doped region from the first doped region; a high-impedance semiconductor component connecting the first doped region to a first supply potential; and the second doped region being connected to a second supply potential.

In accordance with a concomitant feature of the invention, the high-impedance semiconductor component is an LDD transistor.

Other features which are considered as characteristic for the invention are set forth in the appended claims.

Although the invention is illustrated and described herein as embodied in a fuse bank, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE of the drawing is a plan view of a fuse bank.

DESCRIPTION OF THE PREFERRED EMBODIMENTS

Referring now in detail to the single figure of the drawing, there is seen an exemplary embodiment of a fuse bank in which two fuse links 2 that are located above a substrate 1 are insulated from the substrate and are each components of a wider conductive region 8. Two guard rings are located on the surface of the substrate 1, under and around the fuse links 2. One of the guard rings is constructed as a first doped region 5 and the other of the guard rings is constructed as a third doped region 4. The two guard rings are of opposite conduction types and they are separated from one another by an insulating region 9.

The first doped region 5, which in this exemplary embodiment is highly n-doped ($n^+$), is connected through a high-impedance semiconductor component $T_{LDD}$ to a first supply potential VDD which may, for instance, be positive. The high-impedance semiconductor component $T_{LDD}$ is constructed in this exemplary embodiment as an LDD transistor, having a drain and a gate which are connected to one another, so that it functions like a diode. LDD transistors (LDD stands for lightly doped drain) have drain regions which are less strongly doped on their side facing toward the gate than on their side which is farther from the gate. As a result they have higher impedance than conventional transistors.

The third doped region 4 is connected to a third supply potential VBB, which by way of example may be a negative substrate bias voltage. In other embodiments of the invention, it may be omitted.

A second doped region 6, which is of the same conduction type as the first doped region 5, is adjacent the first doped region 5 and separated from it by an insulation 7. However, the second doped region 6 is connected to a second supply potential VSS which, for example, may be ground. If an electrostatic load on terminal pins for the first supply potential VDD or the second supply potential VSS occurs, then a breakdown of a parasitic transistor formed by the first and second doped regions 5 and 6 and the intervening insulation 7 can occur. However, since according to the invention the high-impedance semiconductor component $T_{LDD}$ is provided between the first supply potential VDD and the first doped region 5, the current connected to the breakdown is limited in its magnitude, and damage is avoided.

In other embodiments of the invention it is possible for the conduction type of the doped regions 4, 5, 6 to be reversed and for the corresponding supply potentials VBB, VDD, VSS to have a different polarity from that of the exemplary embodiment described above.

We claim:

1. A fuse bank, comprising:
   a substrate;

a fuse link being disposed above and insulated from said substrate;

a first doped region in said substrate being a guard ring surrounding said fuse link;

a second doped region having the same conduction type as said first doped region and being adjacent said first doped region;

an insulation separating said second doped region from said first doped region;

a high-impedance semiconductor component connecting said first doped region to a first supply potential; and said second doped region being connected to a second supply potential.

2. The fuse bank according to claim 1, wherein said high-impedance semiconductor component is an LDD transistor.

* * * * *